United States Patent
Kubota et al.

(10) Patent No.: US 7,067,226 B2
(45) Date of Patent: Jun. 27, 2006

(54) PHOTOSENSITIVE FILM FOR CIRCUIT FORMATION AND PROCESS FOR PRODUCING PRINTED WIRING BOARD

(75) Inventors: Masao Kubota, Hitachi (JP); Takeshi Ohashi, Hitachi (JP); Tatsuya Ichikawa, Hitachi (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 1 day.

(21) Appl. No.: 10/473,469

(22) PCT Filed: Mar. 29, 2002

(86) PCT No.: PCT/JP02/03211

§ 371 (c)(1),
(2), (4) Date: Sep. 29, 2003

(87) PCT Pub. No.: WO02/079878

PCT Pub. Date: Oct. 10, 2002

(65) Prior Publication Data

US 2004/0112859 A1  Jun. 17, 2004

(30) Foreign Application Priority Data

Mar. 29, 2001 (JP) .............................. 2001-096138

(51) Int. Cl.
*G03F 7/30* (2006.01)
(52) U.S. Cl. ...................... 430/258; 430/260; 430/262; 430/263; 430/281.1
(58) Field of Classification Search ................ 430/258, 430/262, 263, 270.1, 271.1, 273.1, 281.1, 430/288.1, 260
See application file for complete search history.

(56) References Cited

U.S. PATENT DOCUMENTS

| | | | | |
|---|---|---|---|---|
| 3,873,319 A | * | 3/1975 | Berg | 430/273.1 |
| 4,127,436 A | | 11/1978 | Friel | |
| 4,146,627 A | | 3/1979 | Wehinger et al. | |
| 4,405,394 A | | 9/1983 | Cohen | |
| 4,803,145 A | * | 2/1989 | Suzuki et al. | 430/166 |
| 5,609,985 A | * | 3/1997 | Taniguchi et al. | 430/259 |
| 5,698,366 A | * | 12/1997 | Tutt et al. | 430/258 |
| 5,935,761 A | * | 8/1999 | Hwang et al. | 430/281.1 |
| 2004/0018446 A1 | * | 1/2004 | Aoki et al. | 430/271.1 |
| 2004/0038149 A1 | * | 2/2004 | Murakami et al. | 430/270.1 |

FOREIGN PATENT DOCUMENTS

| | | |
|---|---|---|
| EP | 0 040 842 A1 | 12/1981 |
| EP | 0 878 739 B1 | 11/2002 |
| JP | 51-063702 | 6/1976 |
| JP | 52-154363 | 12/1977 |
| JP | 53-031670 | 9/1978 |
| JP | 57-021890 | 4/1982 |
| JP | 57-021891 | 4/1982 |
| JP | 2000-250221 | 9/2000 |
| JP | 2001-042516 | 2/2001 |

OTHER PUBLICATIONS

International Search Report for PCT/JP02/03211, mailed Jun. 18, 2002, 4 pages.

* cited by examiner

*Primary Examiner*—John S. Chu
(74) *Attorney, Agent, or Firm*—Griffin & Szipl, P.C.

(57) ABSTRACT

The photosensitive film for circuit formation of the present invention has: on a first film (base film), a photosensitive layer having a thickness of 0.1 to 10 μm; or a photosensitive layer having a thickness of 0.1 to 14 μm and containing a 2,2-bis(4-((meth)acryloxypolyalkoxy)phenyl)propane.

14 Claims, No Drawings

PHOTOSENSITIVE FILM FOR CIRCUIT FORMATION AND PROCESS FOR PRODUCING PRINTED WIRING BOARD

This is a National Phase Application in the United States of International Patent Application No. PCT/JP02/03211 filed Mar. 29, 2002, which claims priority on Japanese Patent Application No. 2001-096138, filed Mar. 29, 2001. The entire disclosures of the above patent applications are hereby incorporated by reference.

TECHNICAL FIELD

The present invention relates to a photosensitive film for circuit formation and a process for producing a printed wiring board.

BACKGROUND ART

In producing a printed wiring board, a photosensitive film for circuit formation is used to form a resist film for plating or etching. The film is formed by applying a photosensitive resin composition on a first film (base film), drying the applied composition so as to form a photosensitive layer, and then laminating a second film (protective film) on the photosensitive layer. Then, the first film and the photosensitive layer as transfer layers have heretofore been laminated onto a substrate to be laminated of a printed wiring board.

To laminate the conventional photosensitive film for circuit formation, the second film is removed first, and then the transfer layer is placed on the substrate such that the photosensitive layer faces the substrate. Thereafter, a heating roller is pressed against the first film so as to crimp the transfer layer, in other words, the first film and the photosensitive layer, on the substrate.

To expose the photosensitive layer to light, a negative mask is placed on the first film, and the photosensitive layer is irradiated with a ray of light for exposure through the negative mask. Then, when the photosensitive layer is developed after removal of the negative mask and subsequent removal of the first film, the same pattern as that of the negative mask is obtained on the photosensitive layer. With the photosensitive layer remaining on the substrate as a resist film, a subsequent plating or etching step is carried out.

As the first film, a film (such as a polyethylene terephthalate (PET) film) having a 5% elongation load per unit width (in a longitudinal direction) at 80° C. of not lighter than 100 g/mm is used. Its thickness is generally about 20 μm. The first film must have such a thickness so as to increase the tensile strength of the photosensitive film for circuit formation. Further, the film must have hardness to some extent.

The photosensitive layer is constituted by a photosensitive material characterized in that when irradiated with ultraviolet radiation or the like, physical properties of irradiated portions change. As the photosensitive material, a suitable composition is selected according to application purposes. The thickness of the photosensitive layer is set at, for example, 25, 33, 40 or 50 μm, according to needs.

The second film is a protective film which may comprise a polyethylene and have a thickness of, for example, 30 μm.

The transfer layer must conform to pits and projections on the substrate when laminated so as to avoid occurrence of non-crimped portions between the photosensitive layer and the substrate.

In recent years, an increase in density of wiring of a printed wiring board is underway, and high resolution is demanded. To achieve high resolution of the photosensitive film for circuit formation, it is effective to decrease the thickness of the photosensitive layer. However, since the amount of the photosensitive layer to conform to pits and projections on the surface of the substrate is decreased, the conventional photosensitive film for circuit formation has many non-crimped portions between the substrate and the transfer layer. Therefore it cause a problem that a satisfactory yield cannot be obtained. Further, since the first film in the conventional photosensitive film for circuit formation must have the foregoing thickness and hardness, the flexibility of the whole transfer layer is insufficient. Therefore, it is difficult for the transfer layer to conform to pits and projections on the surface of the substrate in order to laminate completely. As a result, many non-crimped portions occur between the substrate and the transfer layer, causing a problem that a satisfactory yield cannot be obtained.

To overcome these problems, a variety of methods have heretofore been proposed. For example, there is a method in which the photosensitive film for circuit formation is laminated on the substrate after water is applied to the substrate (See Japanese Patent Application Laid-Open Nos. 1982-21890 and 1982-21891).

In this method, since a thin water layer is applied uniformly, the surface of the substrate must be cleaned. Further, when a small-diameter through hole is present, water collected in the through hole is liable to cause a reaction with the photosensitive layer, causing a problem such as a reduction in developability.

Further, there is also proposed a method in which the photosensitive film for circuit formation is laminated on the substrate after a liquid resin is laminated on the substrate so as to form an adhesive intermediate layer (See Japanese Patent Application Laid-Open No.1977-154363).

This method has problems such as reductions in developability and removability with respect to a small-diameter through hole and an increase in costs caused by application of the liquid resin.

In addition, there is also known a method by which lamination is carried out under a reduced pressure by use of a vacuum laminator (See Japanese Patent Publication No. 1978-31670 and Japanese Patent Application Laid-Open No. 1976-63702).

This method is rarely used in general circuit formation since it requires an expensive device and it takes time to produce a vacuum. The method is used only for lamination of a permanent mask used after formation of a conductor. In the lamination of the permanent mask as well, a further improvement in conformance to the conductor is desired.

As described above, a photosensitive film for circuit formation which has excellent conformance to a conductor and conforms to an increase in density of wiring of a printed wiring board has heretofore been desired.

DISCLOSURE OF THE INVENTION

The present invention provides a photosensitive film for circuit formation which has a photosensitive layer having a thickness of 0.1 to 10 μm on a first film (base film).

Further, the present invention also provides a photosensitive film for circuit formation which has a photosensitive layer having a thickness of 0.1 to 14 μm and containing a 2,2-bis(4-((meth)acryloxypolyalkoxy)phenyl)propane on a first film. Preferably, the photosensitive layer contains (A) a binder polymer, (B) a photopolymerizable compound having at least one polymerizable ethylenically unsaturated bond, and (C) a photopolymerization initiator.

The binder polymer (A) is preferably a polymer containing methacrylic acid as a copolymerizable component. The binder polymer (A) has an acid value of preferably 100 to 500 mgKOH/g. The binder polymer (A) has a weight average molecular weight of preferably 20,000 to 300,000. The binder polymer (A) preferably contains styrene or a styrene derivative as a copolymerizable component. The content of styrene or the styrene derivative is preferably 0.1 to 30 wt % of all copolymerizable components.

The photopolymerizable compound (B) preferably contains a 2,2-bis(4-((meth)acryloxypolyalkoxy)phenyl)propane.

The 2,2-bis(4-((meth)acryloxypolyalkoxy)phenyl)propane is not necessarily required when the photosensitive layer has a thickness of 0.1 to 10 μm. However, it is preferable to use the 2,2-bis(4-((meth)acryloxypolyalkoxy)phenyl)propane alone or in a combination with other photopolymerizable compounds as the component (B) of the photosensitive layer, when the thickness of the photosensitive layer is 0.1 to 10 μm or 0.1 to 14 μm.

Further, the 2,2-bis(4-((meth)acryloxypolyalkoxy)phenyl)propane is preferably represented by the following general formula (I):

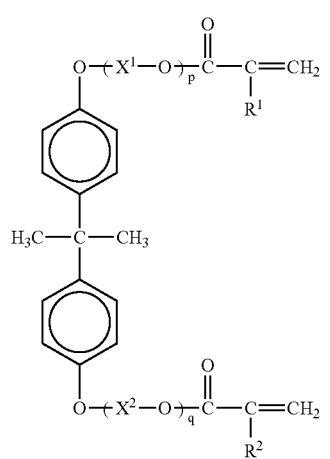

(wherein $R^1$ and $R^2$ each independently represent a hydrogen atom or a methyl group, $X^1$ and $X^2$ each independently represent an alkylene group having 2 to 6 carbon atoms, and p and q are positive integers selected such that p+q=4 to 40.) Of these, $X^1$ and $X^2$ are preferably an ethylene group or a propylene group, and are particularly preferably an ethylene group.

Further, the photosensitive film for circuit formation of the present invention preferably has a cushion layer between the first film and the photosensitive layer, and the cushion layer preferably has higher interlayer adhesion to the first film than to the photosensitive layer. The cushion layer is preferably composed mainly of a copolymer containing ethylene as a copolymerizable component. The copolymer is preferably an EVA (ethylene/vinyl acetate copolymer) containing 60 to 90 wt % of copolymerized ethylene or an EEA (ethylene/ethyl acrylate copolymer) containing 60 to 90 wt % of copolymerized ethylene. The thickness of the cushion layer is preferably 1 to 100 μm.

Further, the photosensitive film for circuit formation of the present invention preferably has a second film (protective film) on the opposite side of a side of the photosensitive layer on which the first film (base film) is present. The second film preferably has lower adhesion to the photosensitive layer than adhesion between the cushion layer and the photosensitive layer.

The present invention also provides a method for producing a printed wiring board using the foregoing photosensitive film for circuit formation.

This method comprises the steps of laminating the foregoing photosensitive film for circuit formation on a substrate while peeling the second film (protective film) such that the photosensitive layer makes contact with the substrate, exposing the laminated film to light, then removing the first film (base film) or cushion layer which is in intimate contact with the photosensitive layer from the photosensitive layer, and then developing the photosensitive layer.

Further, another method comprises the steps of laminating the foregoing photosensitive film for circuit formation having the second film on a substrate while peeling the second film (protective film) such that the photosensitive layer makes contact with the substrate, removing the first film (base film) or cushion layer which is in intimate contact with the photosensitive layer from the photosensitive layer, exposing the photosensitive layer to light, and then developing the photosensitive layer.

The present specification relates to a subject matter contained in Japanese Patent Application No. 2001-96138, filed on Mar. 29, 2001. The disclosure of which is expressly incorporated herein by reference in its entirety.

BEST MODE FOR CARRYING OUT THE INVENTION

Hereinafter, the present invention will be described in detail.

In the present invention, (meth)acrylic acids refer to acrylic acid and corresponding methacrylic acid, (meth)acrylates refer to acrylates and corresponding methacrylates, and (meth)acryloyl groups refer to an acryloyl group and a corresponding methacryloyl group.

A photosensitive film for circuit formation of the present invention may take a two-layer structure in which a photosensitive layer is formed on a first film, a three-layer structure in which a cushion layer is formed between a first film and a photosensitive layer, a three-layer structure in which a second film (protective film) is formed on a photosensitive layer formed on a first film, or a four-layer structure in which a cushion layer and a photosensitive layer are formed on a first film and a second film (protective film) is further formed on the photosensitive layer.

The first film in the present invention is used as a base film. A film which can be used as the first film is not particularly limited. The first film preferably has a film thickness of 2 to 100 μm, more preferably 5 to 20 μm, and particularly preferably 8 to 16 μm. When the thickness is smaller than 2 μm, the first film may be torn when peeled, while when it is larger than 100 μm, its conformance to pits and projections on the surface of an object to be laminated is liable to deteriorate.

Illustrative examples of the above first film include polyesters such as a polyethylene terephthalate and polymer films having heat resistance and solvent resistance such as a polypropylene and a polyethylene.

Further, the photosensitive layer in the photosensitive film for circuit formation in the present invention has a thickness of 0.1 to 10 μm, preferably 1 to 8 μm, and more preferably 3 to 7 μm, from the viewpoints of increases in density and resolution of printed wiring.

Further, when containing a 2,2-bis(4-((meth)acryloxypolyalkoxy)phenyl)propane, the photosensitive layer in the photosensitive film for circuit formation in the present invention has a thickness of 0.1 to 14 μm, preferably 0.1 to 10 μm, more preferably 1 to 10 μm, much more preferably 2 to 8 μm, and particularly preferably 3 to 7 μm, from the viewpoints of increases in density and resolution of printed wiring.

The above 2,2-bis(4-((meth)acryloxypolyalkoxy)phenyl) propane is not particularly limited but is preferably a compound represented by the following general formula (I), for example.

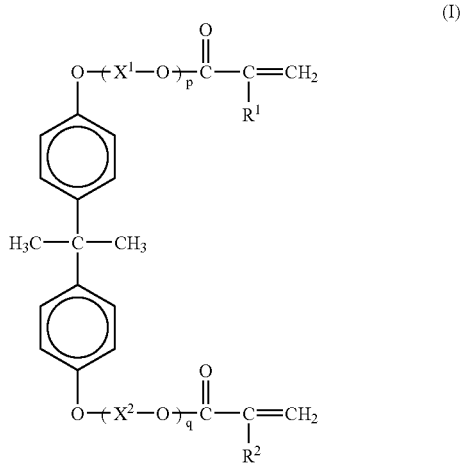

(I)

In the above general formula (I), $R^1$ and $R^2$ each independently represent a hydrogen atom or a methyl group and are preferably a methyl group. Further, in the above general formula (I), $X^1$ and $X^2$ each independently represent an alkylene group having 2 to 6 carbon atoms and are preferably an ethylene group or propylene group, and particularly preferably an ethylene group. In the above general formula (I), p and q are positive integers selected such that p+q=4 to 40. p+q is preferably 6 to 34, more preferably 8 to 30, much more preferably 8 to 28, particularly preferably 8 to 20, extremely preferably 8 to 16 and most preferably 8 to 12. When p+q is smaller than 4, compatibility with a binder polymer (A) which is a constituent of the photosensitive layer deteriorates, so that the photosensitive film is liable to come off when laminated on a substrate intended for circuit formation. On the other hand, when p+q is larger than 40, hydrophilicity increases, so that a resist image is liable to come off at the time of development, and resistance to plating, such as solder plating, is also liable to deteriorate.

Illustrative examples of the above alkylene group having 2 to 6 carbon atoms include an ethylene group, a propylene group, an isopropylene group, a butylene group, a pentylene group, a hexylene group, and their structural isomers. From the viewpoints of resolution and resistance to plating, the alkylene group is preferably an ethylene group or an isopropylene group and is particularly preferably an ethylene group.

Further, aromatic rings in the above general formula (I) may have substituents. Illustrative examples of such substituents include halogen atoms, an alkyl group having 1 to 20 carbon atoms, a cycloalkyl group having 3 to 10 carbon atoms, an aryl group having 6 to 18 carbon atoms, a phenacyl group, an amino group, an alkylamino group having 1 to 10 carbon atoms, a dialkylamino group having 2 to 20 carbon atoms, a nitro group, a cyano group, a carbonyl group, a mercapto group, an alkylmercapto group having 1 to 10 carbon atoms, an allyl group, a hydroxyl group, a hydroxyalkyl group having 1 to 20 carbon atoms, a carboxyl group, a carboxyalkyl group having an alkyl group having 1 to 10 carbon atoms, an acyl group having an alkyl group having 1 to 10 carbon atoms, an alkoxy group having 1 to 20 carbon atoms, an alkoxycarbonyl group having 1 to 20 carbon atoms, an acyloxy group having 2 to 10 carbon atoms, an alkenyl group having 2 to 10 carbon atoms, an N-alkylcarbamoyl group having 2 to 10 carbon atoms or a group having a heterocyclic ring, and aryl groups substituted by these substituents. The above substituents may form a condensed ring. Further, hydrogen atoms in these substituents may be substituted by the above substituents such as halogen atoms. In addition, when each of the aromatic rings is substituted by two or more substituents, these two or more substituents may be the same or different.

Illustrative examples of the compound represented by the above general formula (I) include bisphenol-A-based (meth) acrylate compounds such as a 2,2-bis(4-((meth)acryloxypolyethoxy)phenyl)propane, a 2,2-bis(4-((meth)acryloxypolypropoxy)phenyl)propane, a 2,2-bis(4-((meth) acryloxypolybutoxy)phenyl)propane and a 2,2-bis(4-((meth)acryloxypolyethoxypolypropoxy)phenyl) propane.

Specific examples of the above 2,2-bis(4-((meth)acryloxypolyethoxy)phenyl)propane include 2,2-bis(4-((meth) acryloxydiethoxy)phenyl)propane, 2,2-bis(4-((meth)acryloxytriethoxy)phenyl)propane, 2,2-bis(4-((meth) acryloxytetraethoxy)phenyl)propane, 2,2-bis(4-((meth) acryloxypentaethoxy)phenyl)propane, 2,2-bis(4-((meth) acryloxyhexaethoxy)phenyl)propane, 2,2-bis(4-((meth) acryloxyheptaethoxy)phenyl)propane, 2,2-bis(4-((meth) acryloxyoctaethoxy)phenyl)propane, 2,2-bis(4-((meth) acryloxynonaethoxy)phenyl)propane, 2,2-bis(4-((meth) acryloxydecaethoxy)phenyl), 2,2-bis(4-((meth) acryloxyundecaethoxy)phenyl), 2,2-bis(4-((meth) acryloxydodecaethoxy)phenyl), 2,2-bis(4-((meth) acryloxytridecaethoxy)phenyl), 2,2-bis(4-((meth) acryloxytetradecaethoxy)phenyl), 2,2-bis(4-((meth) acryloxypentadecaethoxy)phenyl), and 2,2-bis(4-((meth) acryloxyhexadecaethoxy)phenyl). These may be used alone or in a combination of two or more.

Of such compounds, for example, 2,2-bis(4-((methacryloxypentaethoxy)phenyl)propane is commercially available as BPE-500 (product of Shin-Nakamura Chemical Co., Ltd., product name), and 2,2-bis(4-((methacryloxypentadecaethoxy)phenyl) is commercially available as BPE-1300 (product of Shin-Nakamura Chemical Co., Ltd., product name).

Specific examples of the above 2,2-bis(4-((meth)acryloxypolypropoxy)phenyl)propane include 2,2-bis(4-((meth) acryloxydipropoxy)phenyl)propane, 2,2-bis(4-((meth)acryloxytripropoxy)phenyl)propane, 2,2-bis(4-((meth) acryloxytetrapropoxy)phenyl)propane, 2,2-bis(4-((meth) acryloxypentapropoxy)phenyl)propane, 2,2-bis(4-((meth) acryloxyhexapropoxy)phenyl)propane, 2,2-bis(4-((meth) acryloxyheptapropoxy)phenyl)propane, 2,2-bis(4-((meth) acryloxyoctapropoxy)phenyl)propane, 2,2-bis(4-((meth) acryloxynonapropoxy)phenyl)propane, 2,2-bis(4-((meth) acryloxydecapropoxy)phenyl), 2,2-bis(4-((meth) acryloxyundecapropoxy)phenyl), 2,2-bis(4-((meth) acryloxydodecapropoxy)phenyl), 2,2-bis(4-((meth) acryloxytridecapropoxy)phenyl), 2,2-bis(4-((meth)

acryloxytetradecapropoxy)phenyl), 2,2-bis(4-((meth) acryloxypentadecapropoxy)phenyl), and 2,2-bis(4-((meth) acryloxyhexadecapropoxy)phenyl). These may be used alone or in a combination of two or more.

Illustrative examples of the above 2,2-bis(4-((meth)acryloxypolyethoxypolypropoxy)phenyl)propane include 2,2-bis(4-((meth)acryloxydiethoxyoctapropoxy)phenyl)propane, 2,2-bis(4-((meth)acryloxytetraethoxytetrapropoxy) phenyl) propane, and 2,2-bis(4-((meth) acryloxyhexaethoxyhexapropoxy)phenyl)propane. These may be used alone or in a combination of two or more.

The cushion layer in the present invention is composed mainly of a copolymer containing ethylene as an essential copolymerizable component. Illustrative examples of the copolymer include an EVA (ethylene/vinyl acetate copolymer) and an EEA (ethylene/ethyl acrylate copolymer). The content of copolymerized ethylene in the EVA or EEA is preferably 60 to 90 wt %, more preferably 60 to 80 wt %, and much more preferably 65 to 80 wt %. When the content of the copolymerized ethylene is lower than 60 wt %, adhesion of the cushion layer becomes high, and adhesion between the cushion layer and the photosensitive layer also becomes high, so that it is seen that peeling of the cushion layer is liable to become difficult. On the other hand, when the content of the copolymerized ethylene is higher than 90 wt %, adhesion between the cushion layer and the photosensitive layer becomes low, so that the cushion layer is liable to come off the photosensitive layer, and preparation of a photosensitive film for circuit formation which includes the cushion layer is liable to become difficult.

As for the relationship of interlayer adhesion among the cushion layer, the first film and the photosensitive layer, interlayer adhesion between the first film and the cushion layer is preferably higher than that between the cushion layer and the photosensitive layer. Thereby, the cushion layer can be peeled from the photosensitive layer.

The layer thickness of the above cushion layer is preferably 1 to 100 μm, more preferably 10 to 50 μm, and much more preferably 15 to 40 μm. When the layer thickness is 1 μm or smaller, conformance to pits and projections on the surface of an object to be laminated is liable to lower, while when the layer thickness is larger than 100 μm, costs are liable to increase. Further, it is also possible to prevent migration of the component (B) or (C) from the photosensitive layer to the cushion layer by incorporating the above component (A), (B) or (C) into the cushion layer in an amount that does not impair the effect of the present invention.

The second film in the present invention is used as a protective film and is removed prior to lamination. A film that can be used as the second film is not particularly limited as long as it has flexibility, can be removably adhered to the photosensitive layer and is not damaged by a temperature in a drying oven. Illustrative examples of such a second film include paper, mold release paper, a polyester film such as a polyethylene terephthalate, a polyolefin film such as a polymethylpentene, a polypropylene or a polyethylene, a halogen-containing vinyl polymer film such as a polyvinyl fluoride or a polyvinyl chloride, a polyamide film such as a nylon, a cellulose film such as a cellophane, and a polystyrene film. These may be transparent or opaque and may have undergone mold release treatment.

Illustrative examples of second films which are available include E-200H which is a product of Oji Paper Co., Ltd. and NF-13 which is a product of TAMAPOLY CO., LTD.

The thickness of the second film in the present invention is not particularly limited. However, in consideration of the size of the photosensitive film of the present invention when rolled up, the thickness of the second film is preferably 5 to 200 μm, more preferably 10 to 100 μm and particularly preferably 10 to 50 μm.

Further, interlayer adhesion between the second film and the photosensitive layer is preferably lower than that between the cushion layer and the photosensitive layer. Thereby, the second film can be peeled from the photosensitive layer.

In short, it is preferable that adhesion ($\alpha$) between the second film and the photosensitive layer be lower than adhesion ($\beta$) between the first film and the photosensitive layer, adhesion ($\gamma$) between the first film and the cushion layer and adhesion ($\delta$) between the cushion layer and the photosensitive layer, in order that the second layer can be peeled easily so as to form a transfer layer.

In other words, it is preferable that the adhesion ($\beta$) between the first film and the photosensitive layer, the adhesion ($\gamma$) between the first film and the cushion layer and the adhesion ($\delta$) between the cushion layer and the photosensitive layer be higher than the adhesion ($\alpha$) between the second film and the photosensitive layer at 180° peel strength. Otherwise, there is no particular limitation.

Further, the photosensitive film for circuit formation of the present invention may have an intermediate layer(s) and/or a protective layer(s) such as an adhesive layer, a light absorbing layer and a gas barrier layer in addition to the first film, the photosensitive layer, and the cushion layer and the second film which are used as required.

The photosensitive film for circuit formation of the present invention which has the above-described lamination structure can be stored in a rolled form.

The photosensitive layer of the present invention comprises (A) a binder polymer, (B) a photopolymerizable compound having at least one polymerizable ethylenically unsaturated bond, and (C) a photopolymerization initiator.

The binder polymer (A) which is a component contained in the photosensitive layer of the present invention is not particularly limited. Illustrative examples thereof include an acrylic resin, a styrene resin, an epoxy resin, an amido resin, an amidoepoxy resin, an alkyd resin, and a phenol resin. From the viewpoint of alkali developability, an acrylic resin is preferred. These can be used alone or in a combination of two or more.

Such binder polymers as an acrylic resin and a styrene resin can be produced by, for example, radical polymerization of polymerizable monomers. Illustrative examples of the above polymerizable monomers include styrene, polymerizable styrene derivatives having a substituent at an α position or in an aromatic ring such as vinyl toluene and α-methylstyrene, acrylamide such as diacetone acrylamide, esters of vinyl alcohol such as acrylonitrile and vinyl-n-butyl ether, alkyl (meth)acrylates, tetrahydrofurfuryl (meth)acrylate, dimethylaminoethyl (meth)acrylate, diethylaminoethyl (meth)acrylate, glycidyl (meth)acrylate, 2,2,2-trifluoroethyl (meth)acrylate, 2,2,3,3-tetrafluoropropyl (meth)acrylate, (meth)acrylic acid, α-bromo(meth)acrylic acid, α-chlor (meth)acrylic acid, β-furyl(meth)acrylic acid, β-styryl (meth)acrylic acid, maleic acid, maleic anhydride, maleic monoesters such as monomethyl maleate, monoethyl maleate and monoisopropyl maleate, fumaric acid, cinnamic acid, α-cyanocinnamic acid, itaconic acid, crotonic acid, and propiolic acid. Illustrative examples of the above alkyl (meth)acrylates include compounds represented by a general formula (II):

(II)

(wherein $R^3$ represents a hydrogen atom or a methyl group, and $R^4$ represents an alkyl group having 1 to 12 carbon atoms),
and compounds obtained by bonding a hydroxyl group, an epoxy group, a halogen group or the like to the alkyl groups of these compounds.

Illustrative examples of the $C_1$ to $C_{12}$ alkyl group represented by $R^4$ in the above general formula (II) include a methyl group, an ethyl group, a propyl group, a butyl group, a pentyl group, a hexyl group, a heptyl group, an octyl group, a nonyl group, a decyl group, an undecyl group, a dodecyl group, and their structural isomers. Illustrative examples of monomers represented by the above general formula (II) include methyl (meth)acrylate, ethyl (meth)acrylate, propyl (meth)acrylate, butyl (meth)acrylate, pentyl (meth)acrylate, hexyl (meth)acrylate, heptyl (meth)acrylate, octyl (meth)acrylate, 2-ethylhexyl (meth)acrylate, nonyl (meth)acrylate, decyl (meth)acrylate, undecyl (meth)acrylate, and dodecyl (meth)acrylate. These can be used alone or in a combination of two or more.

Further, the binder polymer which is the component (A) in the present invention preferably contains a carboxyl group from the viewpoint of alkali developability. The binder polymer can be produced by radical polymerization of a polymerizable monomer having a carboxyl group with other polymerizable monomer. As the polymerizable monomer having a carboxyl group, methacrylic acid, acrylic acid and maleic acid are preferred.

The acid value of such a binder polymer (A) is preferably 100 to 500 mgKOH/g, more preferably 100 to 300 mgKOH/g. When the acid value is smaller than 100 mgKOH/g, development is liable to take a long time, while when the acid value is larger than 500 mgKOH/g, the resistance to developer of a photo-cured resist is liable to deteriorate.

Further, the binder polymer which is the component (A) in the present invention preferably contains styrene or a styrene derivative as a polymerizable monomer from the viewpoint of flexibility. The styrene derivative may be the aforementioned α-methylstyrene. To have good adhesion and peelability, styrene or the styrene derivative as a copolymerizable component is preferably contained in an amount of 0.1 to 30 wt %, more preferably 1 to 28 wt %, and particularly preferably 1.5 to 27 wt %. When the content is lower than 0.1 wt %, adhesion is liable to be poor, while when the content is higher than 30 wt %, a piece to be peeled becomes large, and peeling is liable to take a long time.

The weight average molecular weight of such a binder polymer (A) is preferably 20,000 to 300,000 and more preferably 40,000 to 150,000. When the weight average molecular weight is lower than 20,000, resistance to developer is liable to deteriorate, while when it is higher than 300,000, development time is liable to become long. The weight average molecular weight in the present invention is a value measured by gel permeation chromatography and expressed in terms of standard polystyrene.

The above-described binder polymers (A) are used alone or in a combination of two or more. Illustrative examples of binder polymers which are used in a combination of two or more include two or more binder polymers comprising different copolymerizable components, two or more binder polymers having different weight average molecular weights, and two or more binder polymers having different degrees of dispersion. Further, the binder polymer may incorporate a photosensitive group as required so as to be used as a polymer having a photosensitive group.

As the photopolymerizable compound (B) having at least one polymerizable ethylenically unsaturated bond which is a component contained in the photosensitive layer of the present invention, a variety of photopolymerizable compounds can be used in addition to the foregoing 2,2-bis(4-((meth)acryloxypolyalkoxy)phenyl)propane. Illustrative examples of these photopolymerizable compounds include compounds obtained by reacting a polyhydric alcohol with an α,β-unsaturated carboxylic acid, compounds obtained by reacting a glycidyl-group-containing compound with an α,β-unsaturated carboxylic acid, an urethane (meth)acryl monomer, nonylphenyldioxylene (meth)acrylate, γ-chloro-β-hydroxypropyl-β'-(meth)acryloyloxyethyl-o-phthalate, β-hydroxyethyl-β'-(meth)acryloyloxyethyl-o-phthalate, β-hydroxypropyl-β'-(meth)acryloyloxyethyl-o-phthalate, and alkyl (meth)acrylates.

Illustrative examples of the above compounds obtained by reacting a polyhydric alcohol with an α,β-unsaturated carboxylic acid include polyethylene glycol di(meth)acrylate having 2 to 14 ethylene groups, polypropylene glycol di(meth)acrylate having 2 to 14 propylene groups, trimethylolpropane di(meth)acrylate, trimethylolpropane tri(meth)acrylate, trimethylolpropane ethoxy tri(meth)acrylate, trimethylolpropane diethoxy tri(meth)acrylate, trimethylolpropane triethoxy tri(meth)acrylate, trimethylolpropane tetraethoxy tri(meth)acrylate, trimethylolpropane pentaethoxy tri(meth)acrylate, tetramethylolmethane tri(meth)acrylate, tetramethylolmethane tetra(meth)acrylate, dipentaerythritol penta(meth)acrylate, and dipentaerythritol hexa(meth)acrylate. Illustrative examples of the α,β-unsaturated carboxylic acid include (meth)acrylic acid.

Illustrative examples of the above glycidyl-group-containing compound include trimethylolpropane triglycidyl ether tri(meth)acrylate, and 2,2-bis(4-(meth)acryloxy-2-hydroxy-propyloxy)benzene.

Illustrative examples of the above urethane (meth)acryl monomer include addition reaction products of a (meth) acryl monomer having an —OH group at a β position with isophorone diisocyanate, 2,6-toluene diisocyanate, 2,4-toluene diisocyanate and 1,6-hexamethylene diisocyanate, tris ((meth)acryloxytetraethylene glycol isocyanate)hexamethylene isocyanurate, EO-modified urethane di(meth)acrylate, and EO.PO-modified urethane di(meth)acrylate. EO represents ethylene oxide, and an EO-modified compound has a block structure of an ethylene oxide group. Further, PO represents propylene oxide, and a PO-modified compound has a block structure of a propylene oxide group.

Illustrative examples of the above alkyl (meth)acrylates include methyl (meth)acrylate, ethyl (meth)acrylate, butyl (meth)acrylate, and 2-ethylhexyl (meth)acrylate.

These photopolymerizable compounds including the 2,2-bis(4-((meth)acryloxypolyalkoxy)phenyl)propane are used alone or in a combination of two or more.

Illustrative examples of the photopolymerization initiator (C) which is a component of the photosensitive layer in the present invention include aromatic ketones such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 2-benzyl-2-dimethylamino-1-(4-morpholinophenyl)-butanone-1, and 2-methyl-1-[4-(methylthio)phenyl]-2-morpholino-propanone-1, quinones such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyll,4-naphthoquinone, and 2,3-dimethylanthraquinone, benzoin ether compounds such as benzoin methyl ether, benzoin ethyl ether, and benzoin phenyl ether, benzoin compounds such as benzoin, methyl benzoin, and ethyl benzoin, benzyl derivatives such as benzyl dimethyl ketal, 2,4,5-triarylimidazole dimers such as a 2-(o-chlorophenyl)-4,5-diphenylimidazole dimer, a 2-(o-chlorophenyl)-4,5-di(methoxyphenyl)imidazole dimer, a 2-(o-fluorophenyl)-4,5-diphenylimidazole dimer, a 2-(o-methoxyphenyl)-4,5-diphenylimidazole dimer, and a 2-(p-methoxyphenyl)-4,5-diphenylimidazole dimer, acridine derivatives such as 9-phenylacridine and 1,7-bis(9,9'-acridinyl)heptane, N-phenylglycine, N-phenylglycine derivatives, and cumarine-based compounds. As substituents of the aryl groups of the two 2,4,5-triarylimidazoles, identical, symmetrical compounds or different, asymmetrical compounds may be provided. Further, as exemplified by a combination of diethylthioxanthone and dimethylaminobenzoic acid, a thioxanthone-based compound and a tertiary amine compound may be combined. In addition, from the viewpoints of adhesion and sensitivity, a 2,4,5-triarylimidazole dimer is more preferable. These are used alone or in a combination of two or more.

As for the amounts of the components in the photosensitive layer, the amount of the binder polymer (A) is preferably 40 to 80 parts by weight, more preferably 45 to 70 parts by weight, based on 100 parts by weight of the total amount of the components (A) and (B). When the amount is smaller than 40 parts by weight, a photo-cured product is liable to become brittle, and the film is liable to have poor coatability when used as a photosensitive element, while when it is larger than 80 parts by weight, light sensitivity is liable to be insufficient.

The amount of the foregoing photopolymerizable compound (B) having at least one polymerizable ethylenically unsaturated bond is preferably 20 to 60 parts by weight, more preferably 30 to 55 parts by weight, based on 100 parts by weight of the total amount of the components (A) and (B). When the amount is smaller than 20 parts by weight, light sensitivity is liable to be insufficient, while when it is larger than 60 parts by weight, a photo-cured product is liable to become brittle.

The amount of the foregoing photopolymerization initiator (C) is preferably 0.1 to 20 parts by weight, more preferably 0.2 to 10 parts by weight, based on 100 parts by weight of the total amount of the components (A) and (B). When the amount is smaller than 0.1 parts by weight, light sensitivity is liable to be insufficient, while when it is larger than 20 parts by weight, absorption on the surface of a composition increases at the time of exposure, so that photo-curing of the inside of the composition is liable to be insufficient.

Further, the photosensitive layer may contain a dye such as malachite green, a photo-coupler such as tribromophenylsulfone or leuco crystal violet, a thermal color development inhibitor, a plasticizer such as p-toluenesulfoneamide, a pigment, a filler, an antifoaming agent, a flame retardant, a stabilizer, an adhesion imparting agent, a leveling agent, a peeling promoter, an antioxidant, a perfume, an imaging agent, and a thermal crosslinking agent as required. These additives each may be added in an amount of about 0.01 to 20 parts by weight based on 100 parts by weight of the total amount of the components (A) and (B). These additives are used alone, or in a combination of two or more as required.

To form the photosensitive layer on the first film or cushion layer, a photosensitive resin composition prepared by compounding the components (A), (B) and (C) and, as required, the above additives is applied. Upon application, the photosensitive resin composition can be dissolved in a solvent as required, so as to be applied as a solution having a solid content of about 30 to 60 wt %. Illustrative examples of the solvent include methanol, ethanol, acetone, methyl ethyl ketone, methyl cellosolve, ethyl cellosolve, toluene, N,N-dimethylformamide, and propylene glycol monomethyl ether. These may be used alone or in a combination of two or more.

Such a photosensitive layer preferably has a transmittance of 5 to 75%, more preferably 7 to 60%, and particularly preferably 10 to 40%, with respect to ultraviolet radiation having a wavelength of 365 nm. When the transmittance is lower than 5%, adhesion is liable to be poor, while when it is higher than 75%, resolution is liable to be poor. The above transmittance can be measured by means of an UV spectrometer. An example of the above UV spectrometer is a W beam spectrophotometer 228A of HITACHI LTD.

The method of the present invention for producing a printed wiring board is exemplified by a method in which after the second film, if present, is removed, the photosensitive layer is crimped on a substrate for circuit formation under heat so as to be laminated on the substrate. The lamination is preferably carried out under a reduced pressure from the viewpoints of adhesion and conformance. A surface to be laminated is generally a metallic surface but is not particularly limited. The heating temperature of the photosensitive layer is preferably 70 to 130° C., and a crimping pressure is preferably about 0.1 to 1.0 MPa (about 1 to 10 kgf/cm$^2$). These conditions, however, are not particularly limited. Further, although preheating of the substrate for circuit formation is not required if the photosensitive layer is heated at 70 to 130° C. as described above, the substrate for circuit formation may be preheated so as to further improve laminatability.

The thus laminated photosensitive layer is irradiated with activation radiation image-wise through a negative or positive mask pattern called an artwork. In this case, when the first film or cushion layer present on the photosensitive layer is transparent, the activation radiation may be irradiated either directly or after removal of the first film or the cushion layer. However, when the first film or the cushion layer is opaque, the activation radiation must be irradiated after removal of the film or the layer. As a light source of the activation radiation, a known light source capable of effective irradiation of ultraviolet radiation such as a carbon arc lamp, a mercury vapor arc lamp, a super high pressure mercury lamp, a high pressure mercury lamp or a xenon lamp is used. In addition, a light source capable of effective radiation of visible radiation such as a floodlight for photographs or a sunlamp is also used.

Then, after exposure to the radiation, when the first film or cushion layer is present on the photosensitive layer, the first film or cushion layer is removed first, and unexposed portions are then removed by wet development, dry development or other means so as to produce a resist pattern. In the wet development, a developer suited for the photosensitive resin composition, such as an alkaline aqueous solution, a water-based developer or an organic solvent, is used, and development is carried out by a known method such as spraying, fluctuation immersion, brushing or scraping. As for the developer, one which is, safe stable and easy to use such as an alkaline aqueous solution is used.

As a base of the above alkaline aqueous solution, a hydroxide of an alkali metal such as lithium hydroxide, sodium hydroxide or potassium hydroxide, a carbonate such as lithium carbonate, sodium carbonate, potassium carbonate, ammonium carbonate, lithium hydrogen carbonate, sodium hydrogen carbonate, potassium hydrogen carbonate or ammonium hydrogen carbonate, a phosphate of an alkali metal such as potassium phosphate or sodium phosphate, or a pyrophosphate of an alkali metal such as sodium pyrophosphate or potassium pyrophosphate is used. Further, as the alkaline aqueous solution used in the development, a dilute solution containing 0.1 to 5 wt % of sodium carbonate, a dilute solution containing 0.1 to 5 wt % of potassium carbonate, a dilute solution containing 0.1 to 5 wt % of sodium hydroxide, a dilute solution containing 0.1 to 5 wt % of sodium tetraborate, or the like is preferred.

Further, the alkaline aqueous solution used in the development preferably has a pH of 9 to 11. Its temperature is adjusted according to the developability of the photosensitive layer and is generally about 25 to 35° C. Further, in the alkaline aqueous solution, a surfactant, an antifoaming agent, a small amount of organic solvent for accelerating the development, and other additives may be contained.

The above water-based developer comprises water or an alkaline aqueous solution, and at least one organic solvent. Illustrative examples of alkali materials in this case include borax, sodium metasilicate, tetramethylammonium hydroxide, ethanolamine, ethylenediamine, diethylenetriamine, 2-amino-2-hydroxymethyl-1,3-propanediol, 1,3-diaminopropanol-2, and morpholine, in addition to the foregoing materials. The pH of the developer is preferably as low as possible within a range in which the resist can be developed to a sufficient degree. The pH is preferably 8 to 12, more preferably 9 to 10. Illustrative examples of the above organic solvent include triacetone alcohol, acetone, ethyl acetate, an alkoxy ethanol having an alkoxy group having 1 to 4 carbon atoms, ethyl alcohol, isopropyl alcohol, butyl alcohol, diethylene glycol monomethyl ether, diethylene glycol monoethyl ether, and diethylene glycol monobutyl ether. These are used alone or in a combination of two or more. In general, the concentration of the organic solvent is preferably 2 to 90 wt %, and its temperature can be adjusted according to developability. Further, in the water-based developer, a small amount of surfactant, antifoaming agent or the like can be contained.

Illustrative examples of an organic-solvent-based developer which is used alone include 1,1,1-trichloroethane, N-methylpyrrolidone, N,N-dimethylformamide, cyclohexanone, methyl isobutyl ketone, and γ-butyrolactone. These organic solvents preferably contain water in an amount of 1 to 20 wt % so as to prevent catching fire.

Further, as required, two or more development methods can be used in a combination. Illustrative examples of the development methods include dipping, battling, spraying, brushing, and slapping. Of these, high-pressure spraying is the most suitable for improving resolution.

As post-development treatment, the resist pattern may be heated at about 60 to 250° C. or exposed to about 0.2 to 10 mJ/cm$^2$ as required so as to be further cured before use.

To etch a metallic surface after development, a cupric chloride solution, a ferric chloride solution, an alkali etching solution or a hydrogen-peroxide-based etching solution can be used. However, from the viewpoint of good etch-factor, it is desirable to use a ferric chloride solution.

When a printed wiring board is produced by use of the photosensitive film for circuit formation of the present invention, the surface of a substrate for circuit formation is treated by a known method such as etching or plating by use of a developed resist pattern as a mask. Illustrative examples of the above plating include copper plating such as copper sulfate plating and copper pyrophosphate plating, solder plating such as high-slow plating, nickel plating such as watt bath (nickel sulfate-nickel chloride) and nickel sulfamate plating, and gold plating such as hard gold plating and soft gold plating. Then, the resist pattern can be removed by use of, for example, a stronger alkaline aqueous solution than an alkaline aqueous solution used in development. As for the stronger alkaline aqueous solution, an aqueous solution containing 1 to 10 wt % of sodium hydroxide, an aqueous solution containing 1 to 10 wt % of potassium hydroxide or other alkaline aqueous solution is used, for example.

Illustrative examples of a method to remove the resist pattern include immersion and spraying. Immersion and spraying may be used alone or in combination. Further, a printed wiring board having the resist pattern formed thereon may be a multilayer printed wiring board.

Hereinafter, the present invention will be described in more detail with reference to Examples. However, the present invention shall not be limited to these Examples.

EXAMPLES 1 TO 8 AND COMPARATIVE EXAMPLES 1 TO 6

[Preparation of Photosensitive Layer Material]

Materials shown in Table 1 were compounded to prepare a solution of a photosensitive layer material (I).

TABLE 1

| Item | Material | Amount | |
|---|---|---|---|
| Component (A) | 40-wt % Methyl cellosolve/toluene (weight ratio: 60/40) solution of methacrylic acid/methyl methacrylate/styrene copolymer (weight ratio: 20/60/20, weight average molecular weight: 60,000) | 137.5 | parts by weight (solid content: 55 parts by weight) |
| Component (B) | 2,2'-Bis((4-methacryloxypentaethoxy) phenyl)propane | 30 | parts by weight |
| | Y-Chloro-β-hydroxypropyl-β'-methacryloyloxyethyl-ophthalate | 15 | parts by weight |
| Component (C) | 2-(o-Chlorophenyl)-4,5-diphenylimidazole dimer | 3.0 | parts by weight |
| | 4,4'-Bisdiethylaminobenzophenone | 0.2 | parts by weight |
| Color Developer | Leuco crystal violet | 0.5 | parts by weight |
| Dye | Malachite green | 0.05 | parts by weight |

TABLE 1-continued

| Item | Material | Amount |
|---|---|---|
| Solvent | Acetone | 10 parts by weight |
| | Toluene | 10 parts by weight |
| | Methanol | 3 parts by weight |
| | N,N-Dimethylformamide | 3 parts by weight |

[Preparation of Cushion Layer Materials]

Materials shown in Table 2 were compounded to prepare solutions of cushion layer materials (I), (II) and (III).

TABLE 2

| Item | Material | Ethylene Component (wt %) | Amount (parts by weight) |
|---|---|---|---|
| Cushion Layer (I) | Toluene<br>EVAFLEX EEA709<br>(DU PONT-MITSUI POLYCHEMICALS CO., LTD.) | —<br>65 | 83<br>17 |
| Cushion Layer (II) | Toluene<br>EVAFLEX EV45X<br>(DU PONT-MITSUI POLYCHEMICALS CO., LTD.) | —<br>54 | 83<br>17 |
| Cushion Layer (III) | Toluene<br>EVAFLEX EEA701<br>(DU PONT-MITSUI POLYCHEMICALS CO., LTD.) | —<br>91 | 83<br>17 |

Example 1

[Preparation of Photosensitive Film (1) for Circuit Formation]

On a 16-μm-thick polyethylene terephthalate film (trade name: G2-16, product of TEIJIN LTD.) as a first film, the solution of the photosensitive layer material (I) was applied uniformly such that the material (I) would have a thickness of 4 μm after drying, and the applied solution was dried by means of a hot air convection-type dryer at 100° C. for 10 minutes. Thereafter, the photosensitive layer was protected by a 20-μm-thick biaxially stretched polypropylene film (trade name: E-200H, a product of Oji Paper Co., Ltd.) as a second film so as to obtain a photosensitive film (1) for circuit formation. The obtained photosensitive film (1) for circuit formation was rolled up with the first film exposed to the outside.

Example 2

[Preparation of Photosensitive Film (2) for Circuit Formation]

A photosensitive film (2) for circuit formation was prepared in the same manner as in Example 1 except that the thickness of the photosensitive layer after drying was changed to 6 μm. The obtained photosensitive film (2) for circuit formation was rolled up with the first film exposed to the outside.

Example 3

[Preparation of Photosensitive Film (3) for Circuit Formation]

On a 16-μm-thick polyethylene terephthalate film (trade name: G2-16, product of TEIJIN LTD.) as a first film, the solution of the cushion layer material (I) was applied uniformly such that the material (I) would have a thickness of 10 μm after drying, and the applied solution was dried by means of a hot air convection-type dryer at 100° C. for 10 minutes. Then, on the cushion layer, the solution of the photosensitive layer material (I) was applied uniformly such that the material (I) would have a thickness of 4 μm after drying, and the applied solution was dried by means of a hot air convection-type dryer at 100° C. for 10 minutes. Thereafter, the photosensitive layer was protected by a 20-μm-thick biaxially stretched polypropylene film (trade name: E-200H, a product of Oji Paper Co., Ltd.) as a second film so as to obtain a photosensitive film (3) for circuit formation. The obtained photosensitive film (3) for circuit formation was rolled up with the first film exposed to the outside.

Example 4

[Preparation of Photosensitive Film (4) for Circuit Formation]

A photosensitive film (4) for circuit formation was prepared in the same manner as in Example 3 except that the thickness of the photosensitive layer after drying was changed to 6 μm. The obtained photosensitive film (4) for circuit formation was rolled up with the first film exposed to the outside.

Example 5

[Preparation of Photosensitive Film (5) for Circuit Formation]

A photosensitive film (5) for circuit formation was prepared in the same manner as in Example 3 except that the thickness of the cushion layer after drying was changed to 20 μm. The obtained photosensitive film (5) for circuit formation was rolled up with the first film exposed to the outside.

Example 6

[Preparation of Photosensitive Film (6) for Circuit Formation]

A photosensitive film (6) for circuit formation was prepared in the same manner as in Example 3 except that the thickness of the photosensitive layer after drying was changed to 6 μm and the thickness of the cushion layer after drying was changed to 20 μm. The obtained photosensitive film (6) for circuit formation was rolled up with the first film exposed to the outside.

Example 7

[Preparation of Photosensitive Film (7) for Circuit Formation]

A photosensitive film (7) for circuit formation was prepared in the same manner as in Example 3 except that the thickness of the cushion layer after drying was changed to 30 µm. The obtained photosensitive film (7) for circuit formation was rolled up with the first film exposed to the outside.

Example 8

[Preparation of Photosensitive Film (8) for Circuit Formation]

A photosensitive film (8) for circuit formation was prepared in the same manner as in Example 3 except that the thickness of the photosensitive layer after drying was changed to 6 µm and the thickness of the cushion layer after drying was changed to 30 µm. The obtained photosensitive film (8) for circuit formation was rolled up with the first film exposed to the outside.

Comparative Example 1

[Preparation of Photosensitive Film (9) for Circuit Formation]

A photosensitive film (9) for circuit formation was prepared in the same manner as in Example 1 except that the thickness of the photosensitive layer after drying was changed to 20 µm. The obtained photosensitive film (9) for circuit formation was rolled up with the first film exposed to the outside.

Comparative Example 2

[Preparation of Photosensitive Film (10) for Circuit Formation]

A photosensitive film (10) for circuit formation was prepared in the same manner as in Example 3 except that the thickness of the photosensitive layer after drying was changed to 20 µm. The obtained photosensitive film (10) for circuit formation was rolled up with the first film exposed to the outside.

Comparative Example 3

[Preparation of Photosensitive Film (11) for Circuit Formation]

A photosensitive film (11) for circuit formation was prepared in the same manner as in Example 3 except that the thickness of the cushion layer after drying was changed to 20 µm and the thickness of the photosensitive layer after drying was changed to 20 µm. The obtained photosensitive film (11) for circuit formation was rolled up with the first film exposed to the outside.

Comparative Example 4

[Preparation of Photosensitive Film (12) for Circuit Formation]

A photosensitive film (12) for circuit formation was prepared in the same manner as in Example 3 except that the thickness of the cushion layer after drying was changed to 30 µm and the thickness of the photosensitive layer after drying was changed to 20 µm. The obtained photosensitive film (12) for circuit formation was rolled up with the first film exposed to the outside.

Comparative Example 5

[Preparation of Photosensitive Film (13) for Circuit Formation]

A photosensitive film (13) for circuit formation was prepared in the same manner as in Example 3 except that the cushion layer material (II) was used in place of the cushion layer material (I). The obtained photosensitive film (13) for circuit formation was rolled up with the first film exposed to the outside.

Comparative Example 6

[Preparation of Photosensitive Film (14) for Circuit Formation]

A photosensitive film (14) for circuit formation was prepared in the same manner as in Example 3 except that the cushion layer material (III) was used in place of the cushion layer material (I). The obtained photosensitive film (14) for circuit formation was rolled up with the first film exposed to the outside.

Then, printed wiring boards were prepared in the following manner.

[Preparation of Printed Wiring Board A]

A copper foil having a thickness of 35 µm laminated on glass epoxy substrates (product of HITACHI CHEMICAL CO., LTD., trade name: MCL-E67-$^{35}$S) was grounded by means of a grinder (product of SANKEI CO., LTD.) having a #600-equivalent brush, rinsed, and then dried by an air current so as to obtain copper-clad laminates.

Then, after the obtained copper-clad laminates were heated to 80° C., the photosensitive films (1) to (14) for circuit formation which had been prepared in Examples 1 to 8 and Comparative Examples 1 to 6 were laminated on the above substrates by use of a high-temperature laminator (product of HITACHI CHEMICAL CO., LTD., trade name: HLM-3000) while removing the second films from the films (1) to (14) such that the photosensitive layers faced the substrates and the first films made contact with a roller.

In this case, the speed of the laminate roll was 1.5 m/min, the temperature of the laminate roll was 110° C., and the cylinder pressure of the roll was 0.4 MPa (4 kgf/cm$^2$).

At this time, since adhesion between the photosensitive layer and cushion layer of the photosensitive film (14) for circuit formation was lower than adhesion between the second film and photosensitive layer thereof, the second film could not be peeled easily, so that the film could not be laminated on the copper-clad laminate.

Then, after lamination, the substrates were cooled to 23° C. Then, on the first films, negative masks (negative mask having a Stauffer 21-step tablet and a wiring pattern having a line width/space width of 400/6 to 400/47 (resolution, unit: µm)) were placed, and by use of an exposure instrument manufactured by ORK Manufacturing CO., LTD. (model: EXM-1201, mercury short arc lamp), the films were exposed to energy whose amount was such that the number of remaining steps in the Stauffer 21-step tablet after development would be 6.0.

Then, the first films of the photosensitive films (1), (2) and (9) for circuit formation were peeled, and the first films and cushion layers of the photosensitive films (3) to (8) and (10) to (13) for circuit formation were peeled.

At this time, when the first film and the cushion layer were peeled from the photosensitive film (13) for circuit formation, its photosensitive layer was also peeled, together with the cushion layer.

Then, by use of a 1-wt % sodium carbonate aqueous solution (30° C.), the photosensitive films (1), (3), (5) and (7) for circuit formation were spray-developed for 4 seconds (spraying pressure: 0.18 MPa (1.8 kgf/cm$^2$)), the photosensitive films (2), (4), (6) and (8) for circuit formation were spray-developed for 6 seconds, and the photosensitive films (9) to (12) for circuit formation were spray-developed for 30 seconds, so as to form resist patterns on the substrates. The value of a minimum space width free from undeveloped portions was measured as resolution. The results are shown in Table 3. The smaller the value, the better the resolution.

Then, a cupric chloride etching solution (2 mol/liter CuCl$_2$, 2N—HCl aqueous solution, 50° C., spraying pressure: 0.2 MPa (2 kgf/cm$^2$)) was sprayed for 100 seconds so as to dissolve copper in portions which were not protected by the resist. Thereafter, the resist patterns were removed with a remover (3-wt % NaOH aqueous solution, 45° C., spraying pressure: 0.2 MPa (2 kgf/cm$^2$)) so as to prepare printed wiring boards A having copper lines formed on the substrates.

[Preparation of Printed Wiring Board B]

After substrates were laminated in accordance with the same procedure as used in preparation of the printed wiring boards A, the first films of the photosensitive films (1), (2) and (9) for circuit formation were peeled, and the first films and cushion layers of the photosensitive films (3) to (8) and (10) to (12) for circuit formation were peeled. Then, on the photosensitive layers, negative masks (negative mask having a Stauffer 21-step tablet and a wiring pattern having a line width/space width of 400/6 to 400/47 (resolution, unit: μm)) were placed, and by use of an exposure instrument manufactured by ORK Manufacturing CO., LTD. (model: EXM-1201, mercury short arc lamp), the films were exposed to energy whose amount was such that the number of remaining steps in the Stauffer 21-step tablet after development would be 6.0. Then, development, etching and removal steps were carried out in accordance with the same procedure as used in preparation of the printed wiring boards A so as to prepare printed wiring boards B having copper lines formed on the substrates. The printed wiring boards B were evaluated in the same manner as the printed wiring boards A were evaluated.

Printed wiring boards B using the photosensitive films (13) and (14) for circuit formation could not be prepared due to the same reason as that in preparation of the printed wiring boards A.

[Preparation of Printed Wiring Board C]

Copper-clad laminates having resist patterns formed thereon were obtained in the same manner as in preparation of the printed wiring boards A except that a negative mask having a line width/space width of 1,000 μm/100 μm was used (only the photosensitive film (5) for circuit formation was used). Then, the obtained substrates were immersed in 100 g/l of ammonium persulfate aqueous solution (30° C.) for 10 minutes. Then, the resist patterns were removed with a remover (3-wt % NaOH aqueous solution, 45° C., spraying pressure: 2 kgf/cm$^2$ (0.2 MPa)) so as to obtain copper-clad laminates having a groove depth of 1 to 12 μm and a groove width of 100 μm.

Then, after the obtained copper-clad laminates were heated to 80° C., the photosensitive films (1) to (14) for circuit formation which had been prepared in Examples 1 to 8 and Comparative Examples 1 to 6 were laminated on the above substrates by use of a high-temperature laminator (product of HITACHI CHEMICAL CO., LTD., trade name: HLM-3000) while removing the second films from the films (1) to (14) such that the photosensitive layers faced the substrates and the first films made contact with a roller (the axis of the laminate roll was parallel to the longitudinal directions of grooves on the substrates).

In this case, the speed of the laminate roll was 1.5 m/min, the temperature of the laminate roll was 110° C., and the cylinder pressure of the roll was 0.4 MPa (4 kgf/cm$^2$).

Further, since adhesion between the photosensitive layer and cushion layer of the photosensitive film (14) for circuit formation was lower than adhesion between the second film and photosensitive layer thereof, the second film could not be peeled easily, so that the film could not be laminated on the copper-clad laminate.

Then, after lamination, the substrates were cooled to 23° C. Then, on the first films, negative masks having a wiring pattern (having a Stauffer 21-step tablet and a line width/space width of 100/100 (unit: μm)) were placed in a direction perpendicular to the longitudinal directions of grooves on the substrates and brought into intimate contact with the first films, and by use of an exposure instrument manufactured by ORK Manufacturing CO., LTD. (model: EXM-1201, mercury short arc lamp), the films were exposed to energy whose amount was such that the number of remaining steps in the Stauffer 21-step tablet after development would be 6.0.

Then, the first films of the photosensitive films (1), (2) and (9) for circuit formation were peeled, and the first films and cushion layers of the photosensitive films (3) to (8) and (10) to (13) for circuit formation were peeled.

At this time, when the first film and the cushion layer were peeled from the photosensitive film (13) for circuit formation, its photosensitive layer was also peeled, together with the cushion layer.

Then, by use of a 1-wt % sodium carbonate aqueous solution (30° C.), the photosensitive films (1), (3), (5) and (7) for circuit formation were spray-developed for 4 seconds (spraying pressure: 0.18 MPa (1.8 kgf/cm$^2$)), the photosensitive films (2), (4), (6) and (8) for circuit formation were spray-developed for 6 seconds, and the photosensitive films (9) to (12) for circuit formation were spray-developed for 30 seconds, so as to form resist patterns on the substrates.

Then, a cupric chloride etching solution (2 mol/liter CuCl$_2$, 2N—HCl aqueous solution, 50° C., spraying pressure: 0.2 MPa (2 kgf/cm$^2$)) was sprayed for 100 seconds so as to dissolve copper in portions which were not protected by the resist. Thereafter, the resist patterns were removed with a remover (3-wt % NaOH aqueous solution, 45° C., spraying pressure: 0.2 MPa (2 kgf/cm$^2$)) so as to prepare printed wiring boards C having copper lines formed on the substrates.

When the laminated film does not conform to grooves on the substrate, there is a gap between the resist and the substrate. Because of this gap, an etching solution seeps into points where the resist and the grooves intersect in the copper lines, thereby dissolving copper and causing disconnection of the copper lines. The depth (μm) of the groove at which disconnection occurs was taken as being from conformance to unevenness (the greater the value of the depth, the better the conformance). The results are shown in Table 3.

TABLE 3

| Item Photosensitive Film | | | Ex. 1 (1) | Ex. 2 (2) | Ex. 3 (3) | Ex. 4 (4) | Ex. 5 (5) | Ex. 6 (6) | Ex. 7 (7) |
|---|---|---|---|---|---|---|---|---|---|
| Composition of Cushion Layer | | | — | — | I | I | I | I | I |
| Layer Thickness (μm) | Photosensitive Layer | | 4 | 6 | 4 | 6 | 4 | 6 | 4 |
| | Cushion Layer | | — | — | 10 | 10 | 20 | 20 | 30 |
| Resolution (μm) | Printed Wiring Board | A | 12 | 12 | 12 | 15 | 15 | 18 | 20 |
| | | B | 8 | 10 | 8 | 10 | 8 | 10 | 8 |
| Conformance to Unevenness (μm) | | | 1 | 2 | 4 | 5 | 7 | 7 | 10 |

| Item Photosensitive Film | | | Ex. 8 (8) | Comp. Ex. 1 (9) | Comp. Ex. 2 (10) | Comp. Ex. 3 (11) | Comp. Ex. 4 (12) | Comp. Ex. 5 (13) | Comp. Ex. 6 (14) |
|---|---|---|---|---|---|---|---|---|---|
| Composition of Cushion Layer | | | I | — | I | I | I | II | III |
| Layer Thickness (μm) | Photosensitive Layer | | 6 | 20 | 20 | 20 | 20 | 4 | 4 |
| | Cushion Layer | | 30 | — | 10 | 20 | 30 | 10 | 10 |
| Resolution (μm) | Printed Wiring Board | A | 25 | 20 | 25 | 32 | 45 | — | — |
| | | B | 10 | 18 | 18 | 18 | 18 | — | — |
| Conformance to Unevenness (μm) | | | 10 | 4 | 8 | 12 | 14 | — | — |

Examples 1 and 2 using the photosensitive films (1) and (2) for circuit formation of the present invention had better resolution than Comparative Example 1 using the photosensitive film (9) for circuit formation. Further, when the resolutions of Examples 3 and 4 using the photosensitive films (3) and (4) for circuit formation in which the dried cushion layer had a thickness of 10 μm were compared with the resolution of Comparative Example 2 using the photosensitive film (10) for circuit formation, the former had better resolutions. Similarly, a similar tendency was observed when the thickness of the cushion layer and the thickness of the photosensitive layer were 20 μm and 30 μm. Further, Examples 3 to 8 using the photosensitive films (3) to (8) for circuit formation in which the cushion layer was formed between the first film and the photosensitive layer had better conformance to unevenness than the photosensitive films (1) and (2) for circuit formation having no cushion layer. Meanwhile, in Comparative Examples 5 and 6 using the photosensitive films (13) and (14) for circuit formation, print wiring boards could not be prepared.

The photosensitive films for circuit formation of the present Examples are useful in increasing the density and resolution of printed wiring since they can be made thin and have excellent conformance.

The photosensitive films for circuit formation of the present Examples are flexible at the time of lamination onto a substrate, have good conformance, and can be laminated directly by use of a conventional laminator. Hence, there arises no problem of an increase in production costs caused by a change of devices or a change in steps.

The photosensitive films for circuit formation of the present Examples can improve resolution and resist pattern accuracy, regardless of the surface condition of a substrate, prevent disconnection or a chip in an etching step of printed wiring, improve the yield of a printed wiring board conforming to high densification significantly, and is useful in reducing production costs.

The photosensitive films for circuit formation of the present Examples can change adhesions among the cushion layer, the first film and the photosensitive layer by changing the composition of a copolymer contained in the cushion layer. Therefore, the first film and the cushion layer can be peeled from the photosensitive layer easily, even before exposure to light.

The invention claimed is:

1. A photosensitive film for circuit formation, comprising:
   a first film;
   a cushion layer comprising an ethylene/ethyl acrylate copolymer formed using ethylene as an essential copolymerizable monomer at a copolymerizing ratio of ethylene in the copolymerized monomers of 60 to 90%, by weight; and
   a photosensitive layer having a thickness of 3 to 10 μm on the first film, wherein the cushion layer is present between the first film and the photosensitive layer and the photosensitive layer comprises (A) a binder polymer that is a copolymer formed using a styrene or styrene derivative as an essential monomer, (B) a photopolymerizable compound having at least one polymerizable ethylenically unsaturated bond, and (C) a photopolymerization initiator; and
   interlayer adhesion between the first film and the cushion layer is higher than interlayer adhesion between the cushion layer and the photosensitive layer.

2. The photosensitive film according to claim 1, wherein the photopolymerizable compound (B) having at least one polymerizable ethylenically unsaturated bond includes a 2,2-bis(4-((meth)acryloxypolyalkoxy)phenyl)propane.

3. The photosensitive film according to claim 2, wherein the binder polymer (A) contains methacrylic acid as an essential copolymerizable component.

4. The photosensitive film according to claim 2, wherein the binder polymer (A) has an acid value of 100 to 500 mgKOH/g.

5. The photosensitive film according to claim 2, wherein the binder polymer (A) has a weight average molecular weight of 20,000 to 300,000.

6. The photosensitive film according to claim 2, wherein the binder polymer (A) contains styrene or the styrene derivative in an amount of 0.1 to 30 wt % of all copolymerizable components.

7. The photosensitive film according to claim 2, wherein the 2,2-bis(4-((meth)acryloxypolyalkoxy)phenyl)propane is a compound represented by a general formula (I):

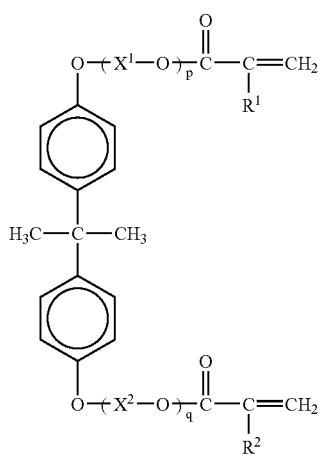

(I)

(wherein $R^1$ and $R^2$ each independently represent a hydrogen atom or a methyl group, $X^1$ and $X^2$ each independently represent an alkylene group having 2 to 6 carbon atoms, and p and q are positive integers selected such that p+q=4 to 40).

8. The photosensitive film according to claim 7, wherein $X^1$ and $X^2$ are an ethylene group.

9. The photosensitive film according to claim 1, wherein the binder polymer (A) contains methacrylic acid as an essential copolymerizable component.

10. The photosensitive film according to claim 1, wherein the cushion layer has a thickness of is 1 to 100 μm.

11. The photosensitive film according to claim 1, wherein a second film is present on the opposite side of a side of the photosensitive layer on which the first film is present.

12. The photosensitive film according to claim 1, wherein a second film is present on the opposite side of a side of the photosensitive layer on which the first film is present, and interlayer adhesion between the second film and the photosensitive layer is lower than that between the cushion layer and the photosensitive layer.

13. A process for producing a printed wiring board, comprising the steps of:
   laminating the photosensitive film for circuit formation according to claim 11 on a substrate while peeling the second film such that the photosensitive layer makes contact with the substrate;
   exposing the laminated film to light;
   removing the first film or the cushion layer from the photosensitive layer; and
   developing the photosensitive layer.

14. A process for producing a printed wiring board, comprising the steps of:
   laminating the photosensitive film for circuit formation according to claim 11 on a substrate while peeling the second film such that the photosensitive layer makes contact with the substrate;
   removing the first film or the cushion layer from the photosensitive layer;
   exposing the photosensitive layer to light; and
   developing the photosensitive layer.

* * * * *